United States Patent [19]

Iannuzo

[11] Patent Number: 5,589,762
[45] Date of Patent: Dec. 31, 1996

[54] ADAPTIVE VOLTAGE REGULATOR

[75] Inventor: James M. Iannuzo, Phoenix, Ariz.

[73] Assignee: SGS-Thomson Microelectronics, Inc., Carrollton, Tex.

[21] Appl. No.: 299,815

[22] Filed: Sep. 1, 1994

Related U.S. Application Data

[63] Continuation of Ser. No. 74,132, Jun. 8, 1993, abandoned, which is a continuation of Ser. No. 659,248, Feb. 22, 1991, abandoned.

[51] Int. Cl.⁶ ............................................. G05F 1/64
[52] U.S. Cl. ................................. 323/351; 323/282
[58] Field of Search ............................. 323/275, 276, 323/279, 282, 299, 303, 281, 349, 351; 320/31, 32

[56] References Cited

U.S. PATENT DOCUMENTS

| 4,321,525 | 3/1982 | Imazeki et al. | |
|---|---|---|---|
| 4,598,243 | 7/1986 | Kawakami | 323/349 |
| 5,084,666 | 1/1992 | Bolash | 323/283 |

FOREIGN PATENT DOCUMENTS

| 230070 | 7/1987 | European Pat. Off. |
| 3003833 | 8/1980 | Germany. |
| 2043382 | 10/1980 | United Kingdom. |
| 2181916 | 4/1987 | United Kingdom. |

OTHER PUBLICATIONS

Electronics, "The Twain meet in new scope", Moskowitz, May 27, 1968, pp.177–178.
IEEE Journal of Solid State Circuits, "A Voltage Reduction Technique for Battery–Operated Systems", Von Kaenel et al., 1990, pp, 1136–1140.
Funkschau Verstarker, "Die Betriebsspannung folgt dem Tonsignal", Dec. 1986, pp. 99–102.
Stromversorgung, "Technisches Plus fur Linearregler", Sax, May 1987, pp, 104–107.

Primary Examiner—Peter S. Wong
Assistant Examiner—Y. J. Han
Attorney, Agent, or Firm—Theodore E. Galanthay; Kenneth C. Hill; Lisa K. Jorgenson

[57] ABSTRACT

A regulated power supply provides a regulated supply voltage at a preselected level under normal operating conditions. When power demands of the circuitry driven by the supply requires a higher voltage, the supply adapts to supply such a higher voltage. Such a supply can be used with automotive electronic circuitry, and can supply voltages up to approximately the voltage available on an automobile battery when such higher power demands occur. The higher supply voltages remain regulated, and return to normal levels when the extra power requirement is removed.

18 Claims, 1 Drawing Sheet

5,589,762

ADAPTIVE VOLTAGE REGULATOR

This is a continuation-in-part of application Ser. No. 08/074,132, filed Jun. 8, 1993 now abandoned, which is a continuation of application Ser. No. 07/659,248, filed Feb. 22, 1991, now abandoned.

BACKGROUND OF THE INVENTION

1. Field of the Invention

The present invention relates generally to electronic circuits, and more specifically to regulated power supplies.

2. Description of the Prior Art

The quality of the power supply voltage is important to the proper operation of many electronic devices. Many types of supplies have been designed to provide, via filtering, supply levels having a constant voltage level and minimal noise. These include passive designs such as LC filters, and active designs such as switching regulated supplies.

Active filters have advantages in that they are smaller and lighter than passive designs incorporating large inductors. In addition, electronic circuitry for building active regulators has become relatively inexpensive, so that active filters can be fabricated to be cost competitive with LC passive designs.

One environment which places harsh demands on electronic circuitry is found in the field of automotive electronics. This is especially true of power supplies, which must regulate an unpredictable and fluctuating battery voltage as well as operate under temperature and humidity extremes. Battery voltages vary widely as a result of battery conditions and other switching loads on the system, such as air conditioners.

Voltage supplies for radios and similar audio electronics are typically regulated at 5 or 10 volts for automotive applications. This is low enough that the battery voltage remains higher than the regulated voltage under most conditions. Battery voltages can reach approximately 14 volts, but the regulated voltage must be lower since such higher battery voltages cannot be counted upon. Typically, the supply for the power amplifier is tied to the battery potential. This means that no regulation takes place for the output stage. Only the internal circuitry of a radio, or other audio device is tied to a regulated supply.

A 10 volt set point for regulation is high enough to provide adequate power to an audio output amplifier under most conditions. However, audio programs sometimes have loud passages that drive the audio output amplifier into saturation and clipping. This causes distortion of the output signal. The distortion due to clipping could be minimized or eliminated in many cases if a higher supply voltage could be used to drive the output amplifier.

It would therefore be desirable to provide a regulated power supply which provides a higher supply voltage in response to increased output signal demands. It would be desirable for such higher voltage to be regulated, and for the supply to provide only a lower regulated voltage when the higher voltages are not required.

SUMMARY OF THE INVENTION

It is therefore an object of the present invention to provide a regulated power supply.

It is a further object of the present invention to provide such a power supply which is adaptive in response to demands from circuitry powered by the supply.

It is another object of the present invention to provide such a power supply which is suitable for use in automotive applications.

Therefore, according to the present invention, a regulated power supply provides a regulated supply voltage at a preselected level under normal operating conditions. When power demands of the circuitry driven by the supply requires a higher voltage, the supply adapts to supply such a higher voltage. Such a supply can be used with automotive electronic circuitry, and can supply voltages up to approximately the voltage available on an automobile battery when such higher power demands occur. The higher supply voltages remain regulated, until the requirements of the amplifier exceed the battery voltage, and return to normal levels when the extra power requirement is removed.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
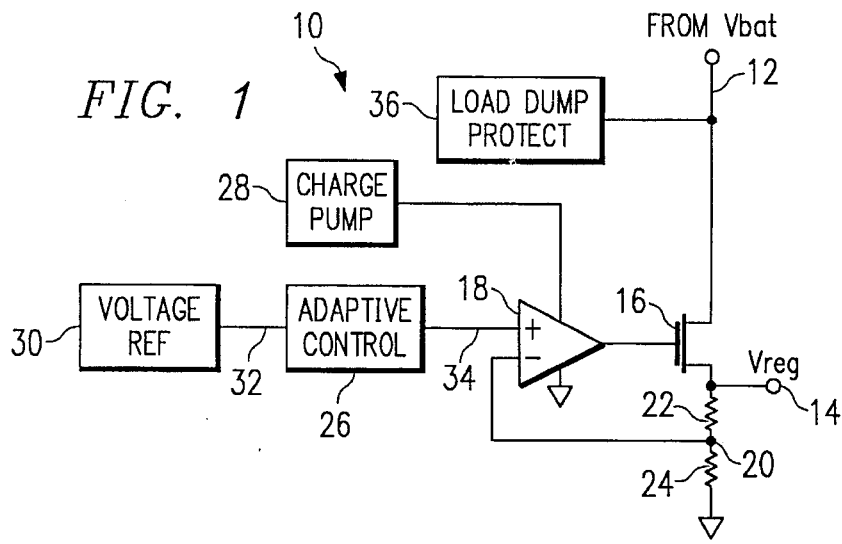
FIG. 1 is a block diagram illustrating a power supply in accordance with the principles of the present invention.

A power supply designed in accordance with the principles of the present invention is illustrated generally as supply 10 in FIG. 1. an input terminal 12 is connected to an automobile battery (not shown), and a regulated output voltage terminal 14 provides a regulated voltage for use with automotive audio electronics and similar circuitry. A switching power transistor 16 is preferably an N-channel field effect power transistor, and is connected between the input terminal 12 and output terminal 14. Transistor 16 is preferably a power DMOS device as known in the art.

The gate of transistor 16 is driven by an error amplifier 18. Amplifier 18 has a negative input coupled to node 20 between sense resistors 22, 24. Amplifier 18 has a positive input connected to adaptive control circuitry 26 which will be described in more detail below.

The error amplifier 18 is powered by a charge pump 28. Charge pump 28 generates voltages higher than normal battery voltages. This higher voltage, which is applied to the gate of transistor 16, is needed to properly drive the N-channel transistor 16. When the output from error amplifier 18 is near the charge pump potential, this higher voltage applied to the gate of power transistor 16 minimizes the voltage drop across power transistor 16. A minimal voltage drop across transistor 16 both minimizes the power dissipated by the transistor, and allows the regulated output voltage at node 14 to be driven closer to the maximum value provided from the battery at input node 12. In the preferred embodiment, charge pump 28 generates a voltage which is triple that of a reference which is approximately 8.5 volts. This provides approximately 25 volts for driving the gate of transistor 16 thereby ensuring a minimal voltage drop across transistor 16. In order to provide a circuit requiring one less external capacitor for the charge pump 28, the input voltage can be merely doubled to approximately 17 volts in return for dropping a slightly higher voltage across the power transistor 16. When the charge pump 28 voltage is approximately 25 volts, the voltage drop across power transistor 16 is on the order of 0.2 to 0.3 volts for a 10 amp load current.

Voltage reference circuitry 30 provides a constant reference voltage for use in regulating the voltage at node 14. Reference circuitry 30 is preferably a stable, temperature insensitive reference such as can be supplied by using a Brokaw bandgap cell. As is known in the art, such a reference cell relies on the difference in $V_{be}$ between two transistors to produce a current through a resistor. The voltage drop across the resistor is added to a $V_{be}$ drop and provides a stable voltage which is output on line 32 to the adaptive control circuitry 26. In the preferred embodiment, the reference voltage generated on line 32 has a value of 1.25 volts.

The resistors 22, 24 are proportioned so that the voltage at node 20 is equal to 1.25 volts when the regulated voltage at node 14 has its proper value. For example, for a regulated output of 10 volts and a reference voltage of 1.25 volts on line 32, resistors 22 and 24 can have values of 49 K ohms and 7 K ohms, respectively.

Adaptive control circuitry 26 has no effect on the reference voltage present on line 32 under normal conditions. Therefore, most of the time the voltage on line 34 is 1.25 volts. As described below, if a higher output voltage is required on supply node 14, adaptive control circuitry 26 will increase the voltage on line 34 slightly above 1.25 volts. The feedback loop through node 20 will cause the error amplifier 18 to drive the voltage at node 14 to a higher value as known in the art.

Load dump protect circuitry 36 senses the voltage entering the system on line 12, and shuts down the electronics temporarily if the voltage rises above a predetermined value, preferably approximately 18 volts. This protects the circuitry from overvoltage damage. As soon as the overvoltage situation ceases, load dump protect circuitry 36 allows the circuitry to resume normal operation. The precise design of load dump protect circuitry 36 as well as charge pump 28 and voltage reference circuitry 30 are similar to those well known in the art, and are not described in detail herein.

Figure 2:
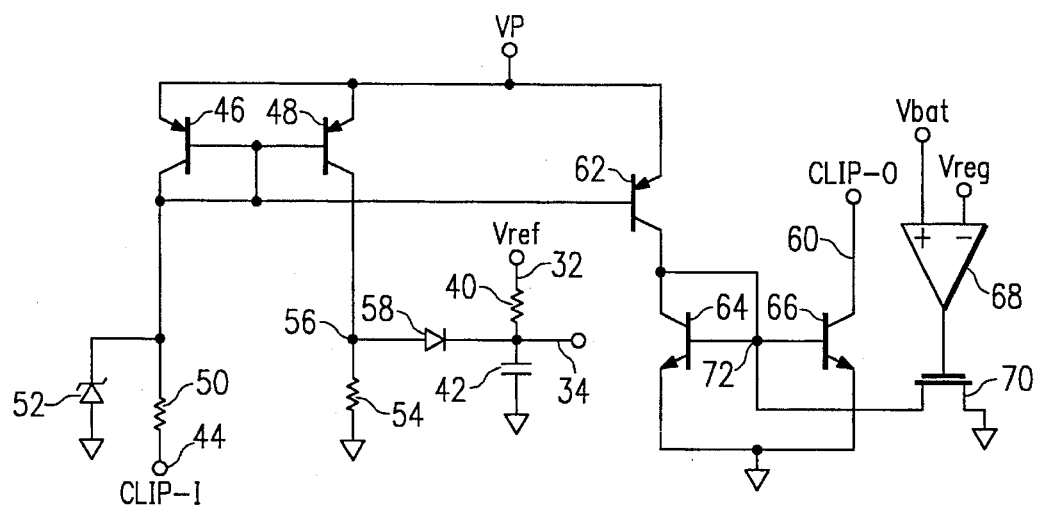
FIG. 2 is a schematic diagram of an adaptive voltage reference circuit in accordance with the principles of FIG. 1.

FIG. 2 is a schematic diagram of a preferred circuit design for adaptive control circuitry 26. The reference voltage on line 32 is connected to output node 34 through resistor 40. Capacitor 42 is connected between output node 34 and ground, so that the voltage across capacitor 42 is that which is applied to the positive input of error amplifier 18.

A clip input signal CLIP-I is available at input node 44. The CLIP-I signal is connected to the current mirror formed by PNP transistors 46 and 48 through resistor 50. The signal CLIP-I indicates whether clipping is occurring at the power amplifier stage. CLIP-I is normally high, so that no current is generated through the current mirror of transistors 46 and 48. If CLIP-I goes low, current flows through transistor 46, and a matching current is mirrored through transistor 48. Zener diode 52 protects the adaptor control circuitry 26 from high voltage transients which could occur at the input node 44.

The CLIP-I voltage preferably varies proportionally with the amount of clipping which is being experienced at the power amplifier stage. When no clipping is being experienced, CLIP-I preferably has a value equal to the supply voltage VP, which is in turn preferably the 8.5 volt supply used to drive the charge pump 28. When clipping occurs, the voltage CLIP-I decreases, causing a current to flow out of the node 44 through resistor 50. The amount of current which flows is limited by the value of resistor 50, which is preferably a few thousand ohms. The current flowing through resistor 50 is proportional to the distortion level of the amplifier.

The current flowing through transistor 46 is mirrored in transistor 48. Resistor 54 acts as a pull down resistor for node 56, to keep the voltage at node 56 low when transistor 48 is off. When transistor 48 is on, a current flows through resistor 54 and diode 58. This generates a voltage at node 56 which is applied to the output signal line 34 through diode 58. Current flowing through the diode 58 is integrated by the capacitor 42, increasing the voltage across it. This increases the voltage on signal line 34, with the increased voltage being applied to the positive input to the error amplifier 18. The rate at which the voltage across capacitor 42 increases is determined by its capacitance according to well known differential equations. As is known in the art, if a large capacitor 42 is used, the voltage across it increases more slowly than if a smaller capacitor 42 is used. Preferably, capacitor 42 is relatively small, so that the attack rate of the signal to line 34 is relatively large when clipping occurs.

When the signal CLIP-I varies proportionally to the amount of clipping which occurs, capacitor 42 is thus seen to be charged more quickly when more clipping occurs at the output stage. An example of a power output device which generates a proportional clipping signal is the TDA7360, manufactured by SGS-Thomson Microelectronics. Proportional clipping signals of this type are known in the art and are typically used to provide an input signal to automatic gain control circuitry. It will be appreciated by those skilled in the art that the signal CLIP-I may simply be a two-valued switched signal, so that a lower value, such as ground, is presented at the input 44 whenever any clipping occurs. Once clipping ceases, the voltage at input node 44 goes high, so that the current mirrored through diode 58 ceases. The amount of distortion experienced will be proportional to the duty cycle of the CLIP-I signal.

When the voltage across the capacitor 42 becomes greater than the 1.25 volt reference voltage, the capacitor 42 will tend to discharge back through the signal line 32 through resistor 40. The rate at which this discharge, called the decay rate, occurs is determined by the RC time constant of resistor 40 and capacitor 42. Resistor 40 is preferably a few hundred ohms, so that such discharge does not occur too quickly. While clipping still occurs, the excess voltage above the reference voltage will be maintained on the capacitor 42 by current flowing through diode 58. Once clipping ceases, the capacitor 42 will discharge until it reaches the reference voltage.

As will be appreciated by those skilled in the art, increasing the voltage at signal line 34 will increase the regulated output voltage Vreg at node 14. With the example described above, with a reference voltage of 1.25 volts and a regulated voltage of 10 volts, a voltage across the capacitor 42 of 1.5 volts will cause the regulated voltage at node 14 to be 12 volts instead of 10. This occurs only when there is clipping at the output signal, and returns to its normal value when clipping ceases. Even when the regulated voltage set point changes, the voltage supplied at 14 actually does continue to be a regulated voltage.

The preferred adaptive control circuit 26 provides an additional function beyond changing the reference voltage sent to the error amplifier 18. This function is the generation of a clip output signal CLIP-O at signal line 60. The output signal on line 60 is a current which mirrors the current flowing out through node 44. PNP transistor 62 is connected as shown so that it also mirrors the current flowing through transistor 46. NPN transistors 64 and 66 form a current mirror, so that the current flowing through transistor 62 is also mirrored on output line 60.

Comparator 68 is used to switch the current mirror formed by transistors 64 and 66 so that the signal CLIP-O is generated only when the regulated voltage has nearly reached the voltage available from the battery. The battery voltage is applied to the positive input of the comparator 68 with the regulated voltage applied to the negative input as shown. An extra diode drop is provided (not shown) at the positive input so that the comparator 68 switches cleanly when the regulated voltage becomes a few tenths of a volt less than the battery voltage.

Under normal conditions, the battery voltage is substantially greater than the regulated voltage, so that comparator 68 generates a positive output, turning on N-channel transistor 70. This causes the voltage at node 72 to be pulled to ground, so that transistors 64 and 66 do not conduct. Even if the signal CLIP-I goes low, causing current to flow through transistor 62, transistors 64 and 66 remain off.

When the regulated voltage rises so that it is a few tenths of a volt less than the battery voltage, the output of comparator 68 goes low and turns off transistor 70. This opens the shunt to ground through transistor 70, so that transistor 64 and 66 begin conducting. At this time, the CLIP-O signal is a current which mirrors CLIP-I current signal. Thus, when the regulated voltage can no longer be increased to prevent clipping, the output signal on line 60 becomes active indicating that the clipping can no longer be compensated for. The signal CLIP-O can be used to drive an automatic gain control circuit to limit the amount of clipping and distortion which occur in the output stage.

Figure 3:
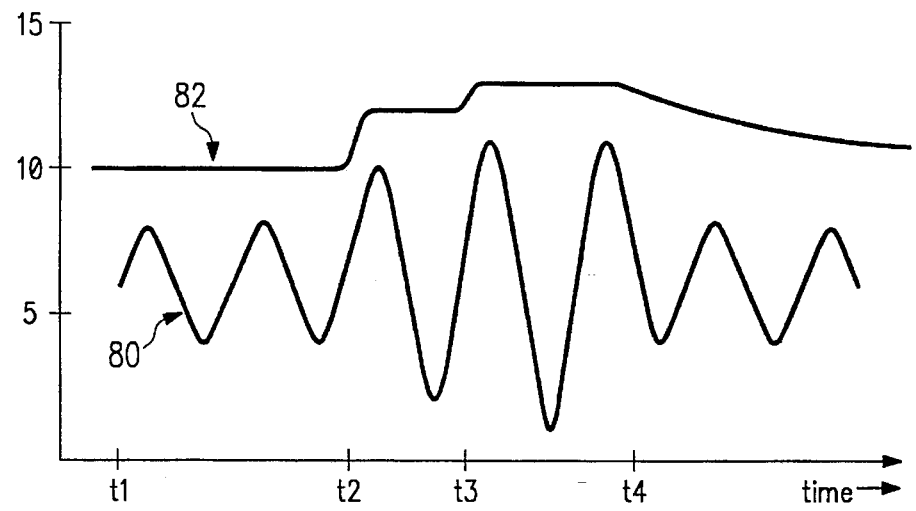
FIG. 3 is a diagram illustrating operating of the preferred power supply in response to an increased output load demand.

FIG. 3 is a simplified example illustrating graphically the operation of the adaptive control circuitry to prevent clipping. Curve 80 represents an output signal generated by an output stage. Curve 82 represents the regulated supply voltage signal generated by the supply 10. Between times t1 and t2, the output signal is small enough that the normal 10 volt regulated supply voltage is sufficient. Between times t2 and t3, the output signal increases in amplitude to the extent that dipping would occur. The clipping signal feeds into the adaptive control circuitry as described above, driving the output voltage to 12 volts. In the example shown, 12 volts is just sufficient to prevent clipping from occurring. Between time t3 and t4, the output amplitude increases still further, requiting that the output voltage rise to 13 volts. If the battery had a voltage of only 12.5 volts, the regulated output voltage would go as high as possible between times t3 and t4, and the clip output signal would be ended. After time t4, the amplitude of the output signal decreases, so that the supply voltage gradually decreases in an exponential curve as the capacitor 42 discharges through the resistor 40.

The power supply described above provides a regulated voltage at a selected level. If the circuitry driven by the supply requires it, a higher regulated voltage is generated. Once the demand ceases, the power supply voltage returns to its originally selected level.

This adaptive regulated supply has a number of advantages over previous supplies. It provides a well regulated lower level voltage most of the time, which provides for optimum circuit operation without excessive power consumption. Good supply voltage rejection will be obtained at all alternator operating frequencies. When the power requirement increases, the supply voltage increases only so much as is necessary to supply that requirement. When the requirement goes away, the voltage returns to its original level.

It will be appreciated by those skilled in the art that the approach described above can be used for applications other than automotive electronics. Any system which could take advantage of an infinitely adjustable, dynamically adaptable regulated supply can use the techniques described above. Any appropriate signal can be used to generate the input signal which indicates that the supply voltage should be increased. Although current mirrors were used in the preferred embodiment, this is not the only method for generating such a signal, and variations in the circuitry shown are contemplated.

While the invention has been particularly shown and described with reference to a preferred embodiment, it will be understood by those skilled in the art that various changes in form and detail may be made therein without departing from the spirit and scope of the invention.

What is claimed is:

1. A circuit for providing a continuously variable power supply voltage, comprising:

a source voltage;

a reference voltage;

a switch for connecting said source voltage to an output node when the voltage at the output node falls below a value determined by said reference voltage; and means for automatically adjusting an output voltage on said output node by increasing said reference voltage by a continuously variable amount in response to a continuously varying input signal indicating that a higher voltage is desired on the output node, wherein the increase in said output voltage is functionally related to the increase in said reference voltage.

2. The circuit of claim 1, wherein said switch comprises:

a differential amplifier having an input connected to said means for automatically adjusting the output voltage;

a sense circuit connected to the output node and to an input of said differential amplifier, wherein said sense circuit provides a voltage proportional to the voltage on the output node to the differential amplifier input; and a transistor connected to an output of said differential amplifier, to said source voltage, and to the output node, wherein said source voltage is connected to the output node when said transistor is turned on by the output of said differential amplifier.

3. The circuit of claim 2, wherein said transistor switch comprises a field effect transistor.

4. The circuit of claim 3, wherein said field effect transistor comprises an N-channel field effect transistor.

5. The circuit of claim 2, wherein said sense circuit comprises two resistors in series, and wherein the proportional voltage is taken from a common node between the two resistors.

6. The circuit of claim 1, wherein the input signal represents a demand of a load connected to the output node.

7. The circuit of claim 1, wherein said means for automatically adjusting the output voltage comprises:

a first input connected to said reference voltage;

a second input connected to the input signal; and a summing circuit connected to said first and second inputs for summing the voltage thereon, wherein an output of said summing circuit is connected to said switch.

8. The circuit of claim 7, further comprising:

a limit signal node connected to said means for automatically adjusting the output voltage; and a control circuit connected to said limit signal node for generating an output signal thereon when the voltage on the output node rises to a value approximately equal to said source voltage.

9. The circuit of claim 8, wherein said control circuit comprises:

a comparator connected to the output node and to said source voltage; and a switch connected to said limit signal node, wherein said switch causes said limit signal node to be held at a selected voltage potential when the voltage at the output node is less than said source voltage by a selected mount, and wherein a voltage proportional to the input signal is connected to said limit signal node otherwise.

10. The circuit of claim 7, wherein the input signal is a voltage representing a distortion level in an amplifier powered by the output node.

11. A method for generating a continuously variable regulated power supply voltage from a source voltage, comprising the steps of:

sensing a voltage at an output node;

comparing the sensed voltage with a reference voltage;

if the sensed voltage falls below a value determined by the reference voltage, connecting the source voltage to the output node;

if the sensed voltage rises above a value determined by the reference voltage, disconnecting the source voltage from the output node; and in response to a continuously varying signal indicating that additional voltage is needed at the output node, automatically adjusting an output voltage on said output node by raising the reference voltage by a continuously variable amount, wherein the increase in said voltage is functionally related to the increase in said reference voltage.

12. The method of claim 11, further comprising the step of:

if the voltage at the output node rises to approximately the value of the source voltage, providing an output signal indicative thereof.

13. The method of claim 12, wherein the provided output signal has a value proportional to the additional voltage indicating signal.

14. The method of claim 11, wherein said reference voltage raising step comprises the step of:

summing the reference voltage with a voltage proportional to the additional voltage indicating signal.

15. A controller for providing a continuously variable regulated power supply voltage, comprising:

a source voltage;

a reference voltage;

means for sensing a voltage at an output node;

means for comparing the reference voltage to the sensed voltage, and for, if the sensed voltage falls below a value determined by the reference voltage, connecting said source voltage to the output node, and for, if the sensed voltage rises above the value determined by said reference voltage, disconnecting said source voltage from the output node; and means for automatically adjusting an output voltage on said output node by increasing said reference by a continuously variable amount in response to a continuously varying input signal indicating that a higher voltage is desired on the output node, wherein the increase in said output voltage is functionally related to the increase in said reference voltage.

16. The controller of claim 15, further comprising:

means for, if the voltage at the output node rises to a value approximately equal to said source voltage, generating an output signal indicative of such condition.

17. The controller of claim 16, wherein the generated output signal is proportional to the input signal.

18. The controller of claim 15, wherein the input signal indicates that a load connected to the output node requires an increased voltage on the output node.

* * * * *